US 6,682,414 B2

(12) United States Patent
Nakao

(10) Patent No.: US 6,682,414 B2
(45) Date of Patent: Jan. 27, 2004

(54) ARTICLE STORAGE SYSTEM FOR A CLEAN ROOM

(75) Inventor: Tatsuo Nakao, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 10/235,423

(22) Filed: Sep. 5, 2002

(65) Prior Publication Data

US 2003/0050005 A1 Mar. 13, 2003

(30) Foreign Application Priority Data

Sep. 10, 2001 (JP) .................................. 2001-273036

(51) Int. Cl.[7] .................................................. B01L 1/04
(52) U.S. Cl. ...................................... 454/187; 414/935
(58) Field of Search ............................ 454/187; 414/217, 414/217.1, 935

(56) References Cited

U.S. PATENT DOCUMENTS 5,997,398 A * 12/1999 Yamada et al. ............. 454/187
6,099,643 A * 8/2000 Ohtani et al. ............... 118/52
6,264,550 B1 * 7/2001 Matsumoto ................. 454/187
6,368,208 B1 * 4/2002 Minoshima ................. 454/187
6,445,441 B1 * 9/2002 Mouri ......................... 355/53

FOREIGN PATENT DOCUMENTS

| JP | 2976755 | 9/1998 |
| JP | 10-294351 | 11/1998 |
| JP | 11-199007 | 7/1999 |
| JP | 2000-264405 | 9/2000 |
| JP | 2001-28388 | 1/2001 |

* cited by examiner

Primary Examiner—Gregory Wilson
(74) Attorney, Agent, or Firm—Webb Ziesenheim Logsdon Orkin & Hanson P.C.

(57) ABSTRACT

A clean room of the down-flow type has, arranged therein an article processing apparatus A for performing a predetermined processing on articles, and an article storage apparatus B having a plurality of article storage units 5. An overlapping apparatus portion is disposed above article receiving portions 15 of the article processing apparatus A in a vertically overlapping relationship. An air guide passage 16 is formed for guiding clean air blown downward from a ceiling area of the clean room, from a rear air passage L to positions under the article storage unit 5 in the overlapping apparatus portion. An air outlet 17 is provided for blowing the air guided by the air guide passage 16 below the article storage units 5, downward toward the article processing apparatus A.

8 Claims, 7 Drawing Sheets

ARTICLE STORAGE SYSTEM FOR A CLEAN ROOM

BACKGROUND OF THE INVENTION

1. Field of the Invention

This invention relates to a storage system for storing articles such as liquid crystal display elements, semiconductor products and the like in a clean environment with little dust therein. More particularly, the invention relates to an improvement in an article storage system installed in a clean room of the down-flow type with air downward from a ceiling area thereof.

2. Description of the Related Art

An article storage system for a clean room has an article transport device for loading articles such as liquid crystal display elements, semiconductor products and the like into a plurality of article storage units, and for transporting the articles stored in the article storage units to an external location. To use this article transport device effectively, a conventional apparatus has an article processing apparatus for performing a predetermined processing on the articles, installed close to the article transport device for transporting the articles to and from the article processing apparatus. This arrangement reduces transport time and improves operating efficiency. Moreover, to make good use of space, a storage space is provided above an article receiving section of the article processing apparatus so that it overlaps with the article receiving portions vertically. In this way, effective use is made of installation space to improve storage efficiency (see Japanese Publication of Patent Application No. H10-294351, for example).

Such an article storage system must store articles in a clean environment with little dust. Thus, the storage system is installed in a down-flow type clean room where air cleaned through an air cleaning filter is blown down from the ceiling area. The clean air blown down from the ceiling above storage racks is received in air intake areas at the upper end to flow from rear air passages through storage spaces in the respective storage units and down a front air passage. In the conventional article storage system, as shown in FIG. 8, for example, the bottom portion 30 of the overlapping apparatus portion 7 of article storage apparatus B is closed. All of the clean air received in the air intake 13 at the upper end flows through the storage spaces of article storage units 5 and down the front air passage M. As a result, the clean air from the ceiling plane 2 is not supplied to the article receiving portions 15 of the article processing apparatus disposed below the overlapping apparatus portion. Thus, fan filter units FU each including a fan and an air cleaning filter are provided above the article processing apparatus A in order to ensure a clean environment for the area of the article processing apparatus for loading and unloading articles by the article transport device.

While the above conventional construction can assist in providing a clean environment for the loading and unloading locations of the article processing apparatus, as shown in FIG. 8, the clean air flowing from the ceiling down in the rear region of the article storage apparatus is drawn by the fan filter units, whereby the clean air flow (down-flow) could be disturbed and becomes turbulent near the corner (CR) disposed above the article receiving portions. This could have an adverse effect in maintaining clean air for other parts of the apparatus.

SUMMARY OF THE INVENTION

This invention intends to solve the problem of the prior art.

An object of this invention, therefore, is to provide an article storage system for a clean room, which effectively avoids disturbances of a clean air flow, which results in an adverse effect on clean air for other apparatus.

Another object of this invention is to simplify the construction of an article storage system.

According to the present invention, clean air received in an air intake is guided by an air guide passage to flow from a rear air passage to positions below storage units in an overlapping apparatus portion. Thereafter, the air guided by the air guide passage from the rear air passage to below the storage units is blown from the air outlet downwardly toward the article processing apparatus. The flow of clean air created this way will less likely cause turbulence that disrupt the clean environment in the area of the article processing apparatus for loading and unloading articles by an article transport device.

DESCRIPTION OF THE PREFERRED EMBODIMENT

Figure 1:
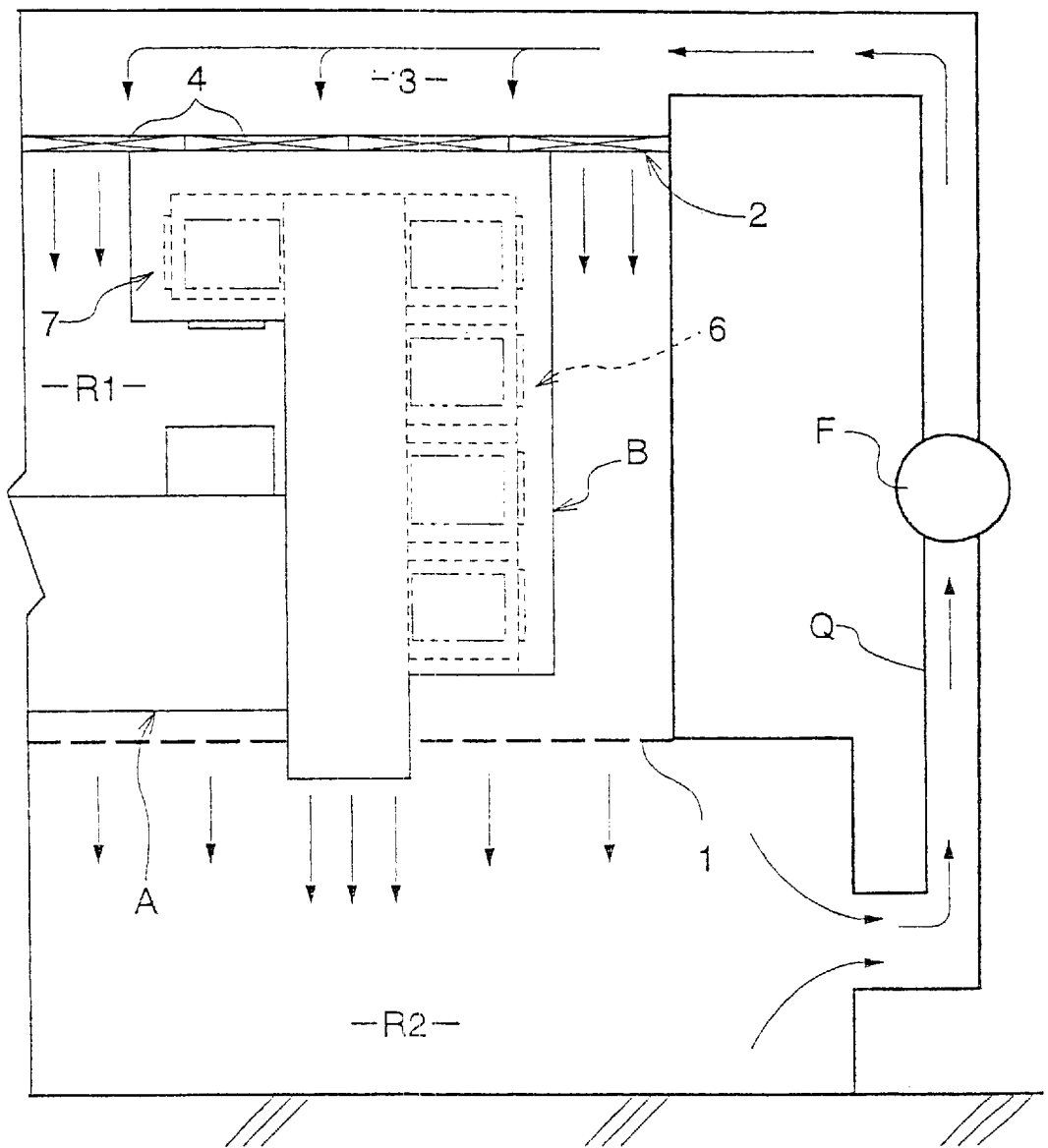
FIG. 1 is a side view showing an article storage system according to this invention installed in a clean room.

A storage system for a clean room according to this invention will be described hereinafter with reference to the drawings. FIG. 1 shows the article storage system installed, for example, in an indoor space cleaned to have little dust therein for storing semiconductor products, liquid crystal display elements or the like. At an initial stage or in the course of manufacture, the above-noted products must be kept in an environment having little dust or other such fine particles. This article storage system is used to store such articles in a space cleaned to have little dust therein.

The room where this article storage system is installed is a down-flow type clean room where clean air is blown down from a ceiling area. Specifically, the clean room R1 has a floor area formed as a meshed grating floor 1 defining numerous vents. A suction room R2 is formed below the grating floor 1 to define a suction space. As shown in FIG. 1, a ventilating fan F draws air from the clean room R1 through the space in the suction room R2 and circulating path Q. The air drawn flows into an air chamber 3 formed above a ceiling plane 2 of the clean room R1. Then, the air is cleaned while passing through air filters 4, such as HEPA (High Efficiency Particulate Air) filters, arranged in the ceiling plane 2 of the clean room R1, and is blown down into the clean room R1.

Thus, the air in the clean room R1 is circulated through the path noted above, to be blown down from the ceiling plane 2 as a constantly cleaned supply of air, to maintain the clean room R1 in a highly clean condition.

Next, the construction of the article storage system will be described with reference to FIGS. 2 through 6. This article storage system, broadly, includes an article processing apparatus A for performing a predetermined processing on articles, and an article storage apparatus B having a plurality of article storage units 5. Specifically, the article storage apparatus B includes one main rack body 6 having a plurality of article storage units 5 arranged vertically and horizontally for storing articles C, and another main rack body 6 having a plurality of article storage units 5 arranged in a single horizontal row. These main rack bodies 6 and 7 are arranged in a fore and aft relationship with a predetermined spacing in between. A stacker crane 9 is provided in the spacing between the two main rack bodies 6 and 7 to act as an article transport device for transporting the articles between the plurality of article storage units 5 and a conveyer device 8 that carries the articles into and out of the system as described hereinafter. This stacker crane 9 transport the articles also between one article storage unit 5 and another article storage unit 5. In place of the stacker crane, the article transport device may comprise a device including an elevator extending horizontally that moves vertically, and a transporting vehicle horizontally movable on the elevator.

Figure 2:
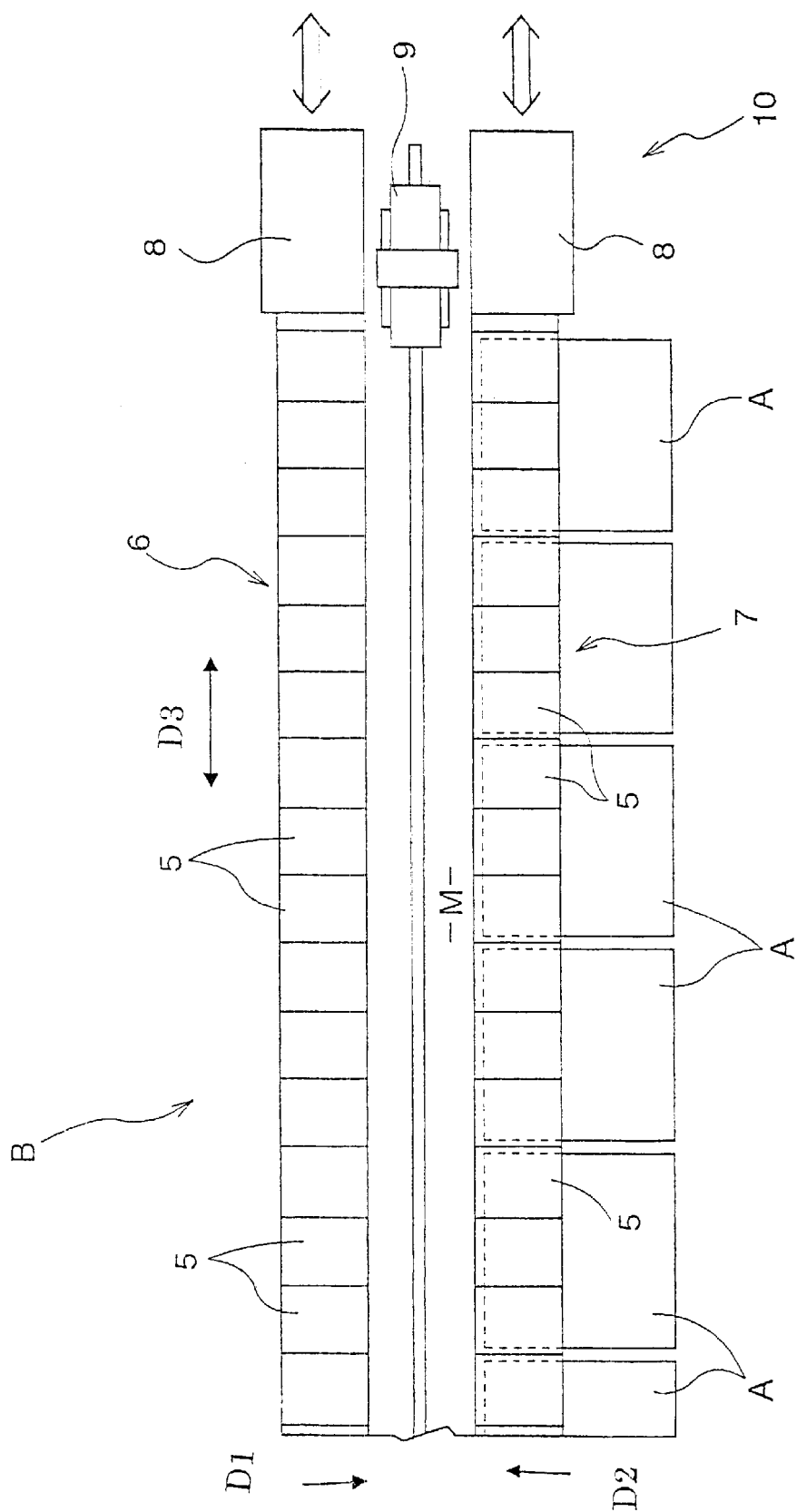
FIG. 2 is a top plan view of an article storage apparatus.

The terms used in this specification to indicate various directions will now be clarified with reference to FIG. 2 which is a top plan view of the article storage system. The article storage units 5 of the main rack body 6 are open toward the stacker crane 9. Thus, the main rack body 6 has a forward direction thereof indicated by an arrow D1. Similarly, the main rack body 7 has a forward direction thereof indicated by an arrow D2. Consequently, the direction along the arrows D1 and D2 is called the fore and aft direction of the main rack bodies 6 and 7. In addition, the direction indicated by an arrow D3 is defined as the sideways direction.

An article input/output section 10 is provided at one end of the article storage apparatus B for taking the articles in and out of the storage apparatus B. The conveyer device 8 is provided to the article input/output section 10 to receive the articles C from the stacker crane 9 to transport them out from the article storage apparatus B, and to transfer the articles C from the external location to the stacker crane 9. The stacker crane 9 has a carriage 9c movable in the sideways direction on a running rail 9a laid on the floor, with an upper end thereof guided along a guide rail 9b installed on the ceiling. The carriage 9c includes a vertically movable transfer device 9d for transferring the articles between the article storage units 5 and conveyer device 8, and between the article storage units 5. The stacker crane 9 can transfer the articles between the plurality of article storage units 5, the conveyer device 8 and the article processing apparatus A to be described hereinafter.

Figure 5:
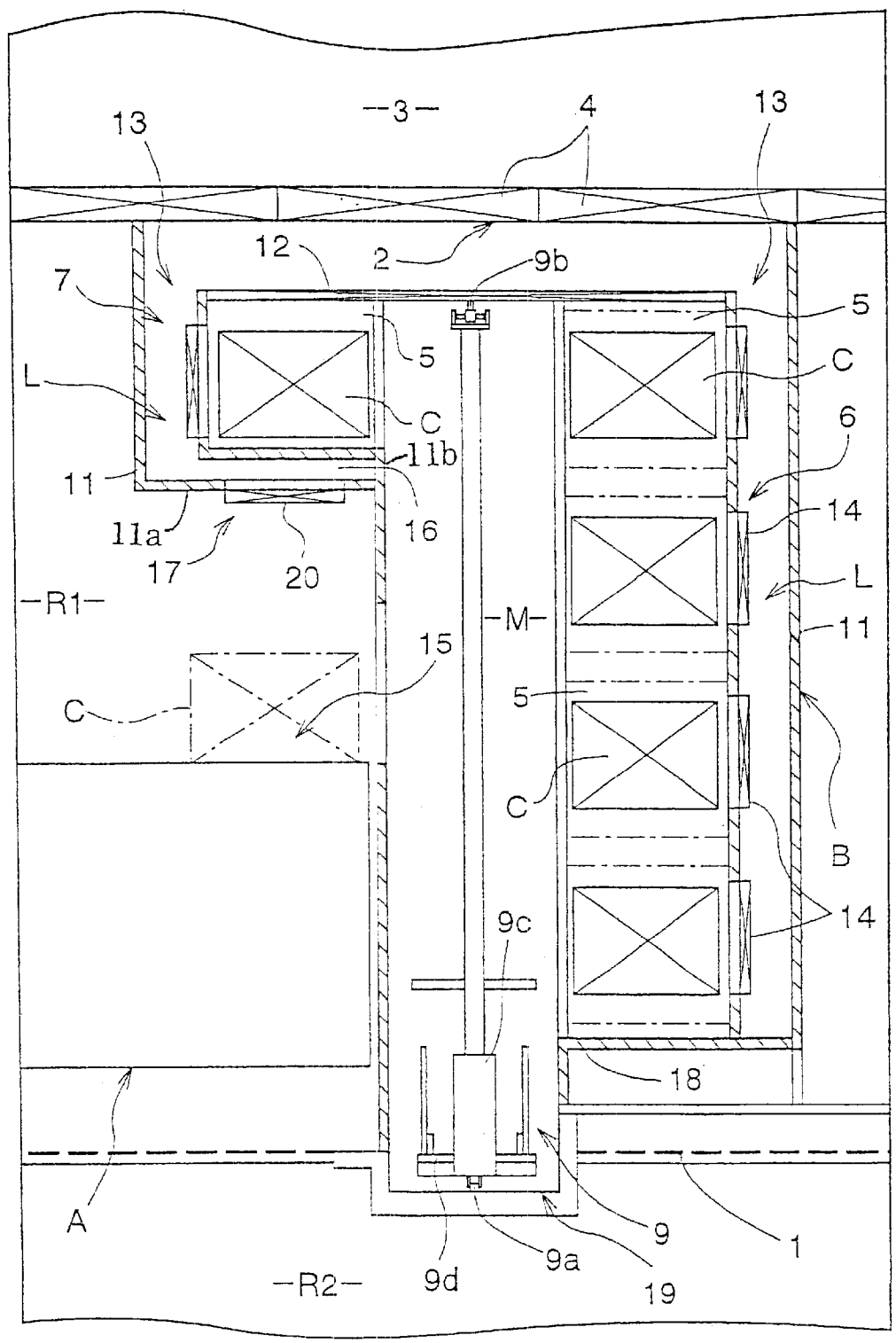
FIG. 5 is a side view in vertical section of the article storage apparatus.

Each of the main rack bodies 6 and 7 has a front plane facing the stacker crane 9, and a plane on the opposite side of a main rack body 6 or 7 which will be called herein the rear plane. As shown in FIG. 5, a rear air passage L is formed between the rear plane of each main rack body 6 or 7 and a cover 11 covering adjacent peripheral areas of the main rack body 6 or 7. Further, a front air passage M is formed in the space accommodating the stacker crane 9 adjacent the front planes of the main rack bodies 6 and 7. The upper ends of the main rack bodies 6 and 7 and the upper end of the front air passage M are covered by a ventilation damper 12 for preventing passage of air in the vertical direction in those areas.

An air intake area 13 is formed at the upper end of each rear air passage L. The front plane of each article storage unit 5 is open for loading and unloading of the articles C by the stacker crane 9. The rear plane of each article storage unit 5 has an air flow adjuster 14 for adjusting a rate of air passing therethrough. The air flow adjuster 14 includes a device for adjusting an amount of opening in the rear plane by using one or more shutter plates to close the opening partly or completely. The device may employ a sliding shutter plate or plates that slide relative to the opening to close the opening, or a swinging shutter plate or plates that pivot relative to the opening to close the opening.

Figure 3:
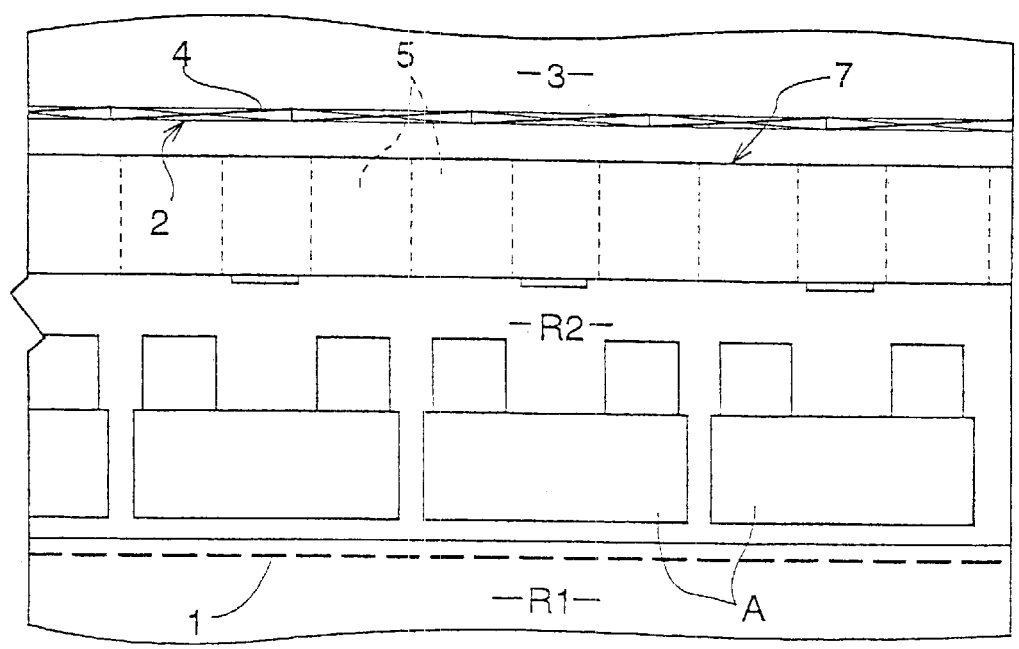
FIG. 3 is a front view of the article storage apparatus and an article processing apparatus.
Figure 4:
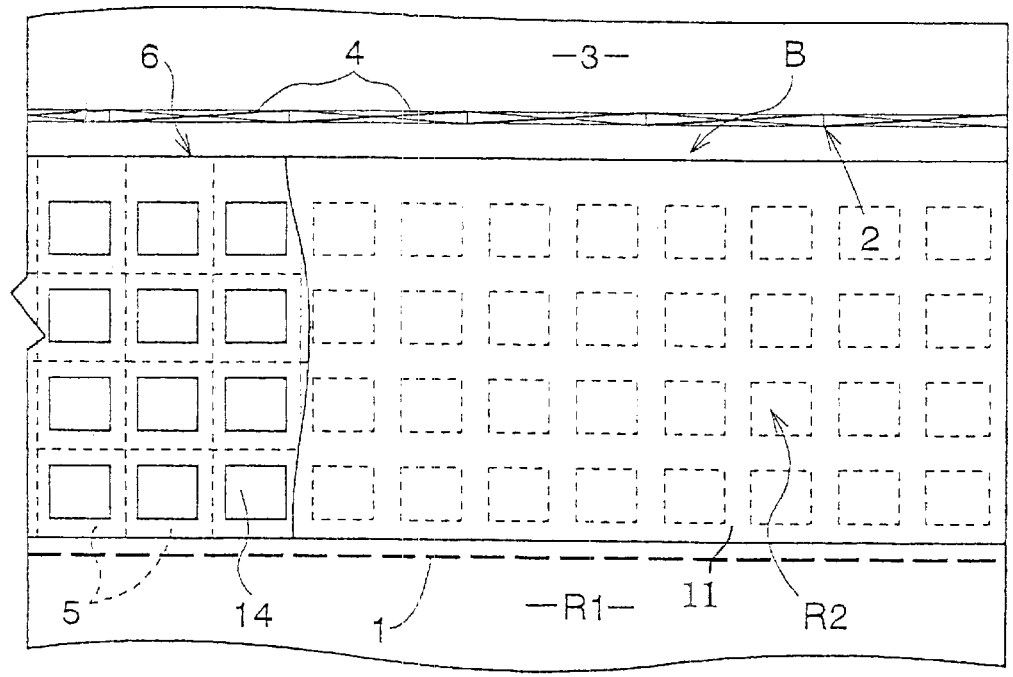
FIG. 4 is a rear view of the article storage apparatus.

As shown in FIGS. 2 and 3, the article processing apparatus A is disposed below one main rack body 7 of the two main rack bodies 6 and 7, so as to overlap with the main rack body 7 vertically. That is, at least part of the main rack body 7 is an overlapping apparatus portion located over article receiving portions 15 of the article processing apparatus A to overlap the article receiving portions 15 vertically. The article processing apparatus A includes a plurality of processing units arranged along the sideways direction in which the article storage units 5 are arranged. Though details of the processing are not described, these processing units of the article processing apparatus A are constructed to perform plural types of chemical processing successively for manufacturing semiconductor products or liquid crystal display elements.

Figure 6:
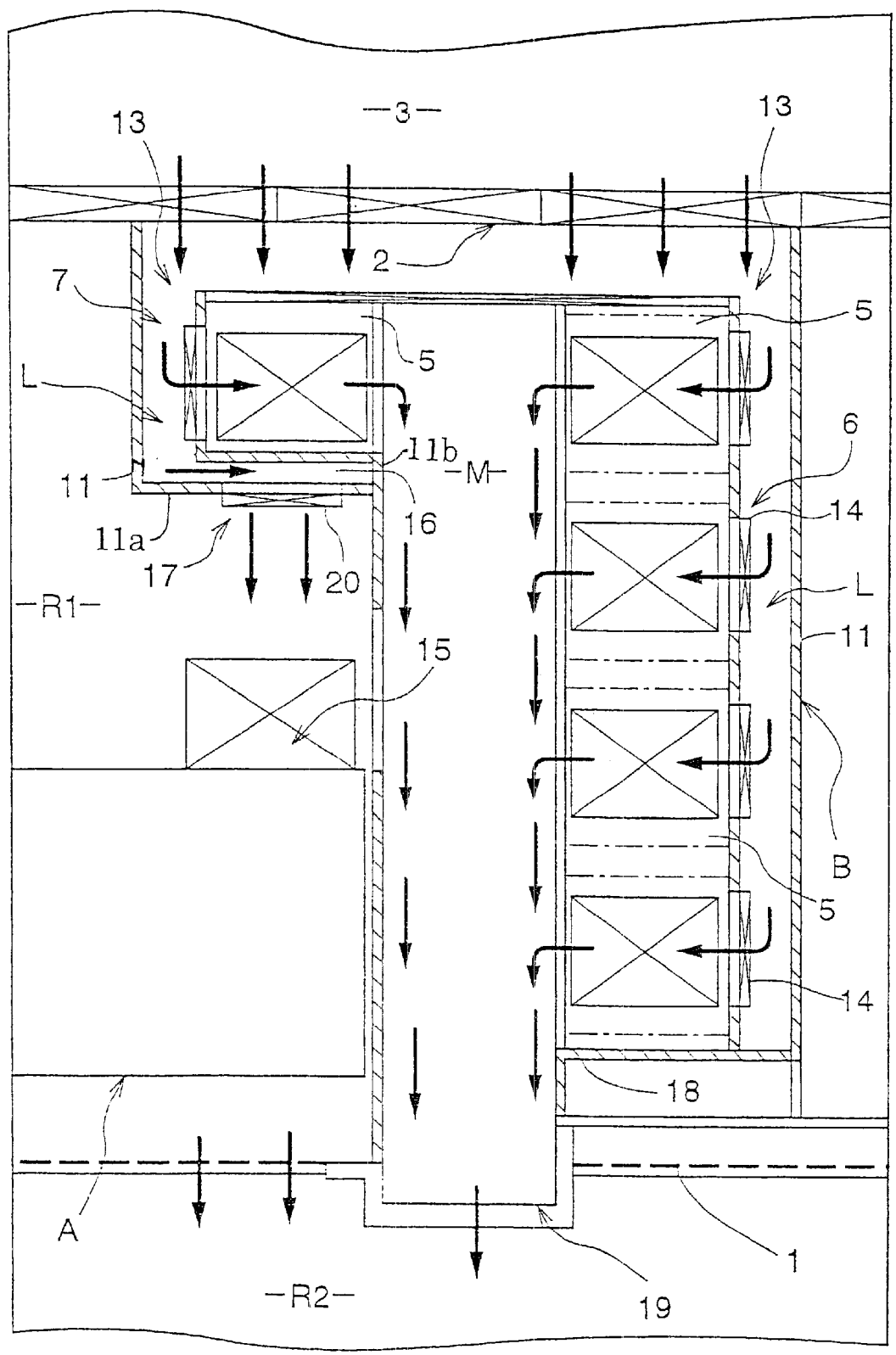
FIG. 6 is a side view in vertical section showing a ventilating state.

As shown in FIG. 6, clean air blown downward from the ceiling plane 2 of the clean room R1 is received in the air intake areas 13 in the upper positions. Then, the air flows along the rear air passages L, through storage spaces in the respective article storage units 5, and down the front air passage M. Further, one of the main rack bodies 7 of the article storage apparatus B defines an air guide passage 16 for guiding the air received in the air intake area 13 to flow through the rear air passage L to positions under the article storage units 5 of the main rack body 7. Air outlets 17 are formed for blowing the air guided by the air guide passage 16 under the article storage units 5, down toward the article processing apparatus A.

The above construction and air flows will be described in greater detail hereinafter.

In the main rack body 6 of the article storage apparatus B not vertically overlapping the article processing apparatus A, the article storage units 5 are arranged in four vertical stages, and the rear air passage L continuously extends from the air intake area 13 at the upper end to a position adjacent the lower end of the apparatus. The lower end of the rear air passage L is blocked by a cover plate 18 to stop air flowing out downward. An air outlet 19 is formed at the lower end of the front air passage M where the stacker crane 9 is disposed, for allowing air to flow out downward. Consequently, the clean air blown downward from the ceiling plane 2 of the clean room R1 is received in the air intake area 13 in the upper position. Then, the air flows along the rear air passage L, through storage spaces in the respective article storage units 5, and down the front air passage M. At this time, the air flow adjustors 14 disposed in the rear planes of the respective article storage units 5 adjust the air flows through the storage spaces of the article storage units 5 to be at substantially the same flow rate.

In the main rack body 7 vertically overlapping the article processing apparatus A, the article storage units 5 are arranged in one row in the sideways direction, with the rear air passage L formed behind the article storage units 5 arranged in the row. As with the other main rack body 6, the clean air blown downward from the ceiling plane 2 of the clean room R1 is received in the air intake area 13 in the upper position. Thereafter the air flows from the rear air passage L through the storage spaces of the respective article storage units 5, and down the front air passage M. As shown in FIG. 6, the air guide passage 16 is formed for guiding the air received in the air intake area 13 to flow through the rear air passage L to the positions under the article storage units 5 of the main rack body 7. As shown in FIGS. 5 and 6, the air guide passage 16 extends generally horizontally and is defined by the bottoms of the article storage unit 5 and a horizontal portion 11a of the cover 11. In addition, a wall 11b is disposed between the air guide passage 16 and front air passage M to stop the air flowing from the air guide passage 16 to the front air passage M. The air outlets 17 are provided for blowing the air guided by the air guide passage 16 under the article storage units 5, down toward the article processing apparatus A. The air outlets 17 are located between the article storage unit 5s and article processing apparatus A overlapping each other. An air guide passage device defining the air guide passage 16 includes the bottoms of the article storage units 5, the horizontal portion 11a of the cover body 11, and the air outlets 17. However, the upper surface of the air guide passage device may not necessarily be provided by the bottoms of the article storage units 5, but may be provided by a wall or walls separate from the article storage units 5. The air guide passage device may be formed of metal, resin, plastic or vinyl.

As described above, the clean air is blown down to the article receiving portions 15 of the article processing apparatus A to provide a high level of cleanliness for the article receiving portions 15. Moreover, the air outlets 17 have air flow adjustors 20 acting as air flow adjusting device for adjusting a rate of air blown. Though not described in detail, the air flow adjustors 20 are constructed, as are the air flow adjustors 14 provided for the article storage units 5, to adjust a flow rate of air passing therethrough by means of an ordinary opening amount adjusting device such as a slide control mechanism or swing control mechanism. The air flow adjustors 20 may adjust the rate of downward air flow to be substantially in the same condition as the downward flow through the ceiling plane 2 of the clean room R1, hence little possibility of causing turbulence.

Other embodiments will be set out hereinafter.

(1) In the above embodiment, the air outlets have air flow adjustors 20 acting as air flow adjusting device for adjusting a flow rate of air blown, and these adjustors 20 simply adjust the rate of air passing therethrough. However, the air flow adjusting device is not necessarily limited to these air flow adjustors 20 and the air flow adjustors 14 disposed in the rear planes of the article storage units 5. The functions of air flow adjustors 14 and air flow adjustors 20 are to adjust the flow rate of air exiting output ends thereof. This function may be performed by motor drive type fans that can adjust flow rate instead of adjusting the opening amount by using the described shutter plates. Or, these two methods may be used in combination. The fans may be used with air cleaning filters attached thereto. Preferably, an adjusting device is provided for manually or automatically adjusting the air flow rate from the air flow adjustors 14 and 20, for example, by varying the flow rate from the fans. The plurality of air flow adjustors 14 disposed in the rear planes of the respective article storage units 5 may be adjusted individually by adjusting devices arranged, for example, in lower positions of the main rack body 6, or collectively by one adjusting device. Further, the flow rate from the fans may be controlled in a plurality of stages such as "high", "medium" and "low", or steplessly by using an inverter. Where the adjusting device is manually operable, a knob may be used as a control, or a digital display and input buttons may be used.

In this invention, air may be supplied in at a constant rate at all times without providing such flow rate adjusting device.

(2) In the foregoing embodiment, the overlapping apparatus portion vertically overlapping the article receiving portions of the article processing apparatus has a plurality of article storage units arranged in a sideways row. Instead of this construction, the article storage units may be arranged in a plurality of vertical stages.

(3) In the foregoing embodiment, each article storage unit has an air flow adjustor attached to the rear plane thereof for simply varying the rate of air passing therethrough. Instead, each article storage unit may have a fan filter unit with a fan and an air cleaning filter. The fan filter unit may clean air and force the air through the storage space of the article storage unit and down the front air passage.

Figure 7:
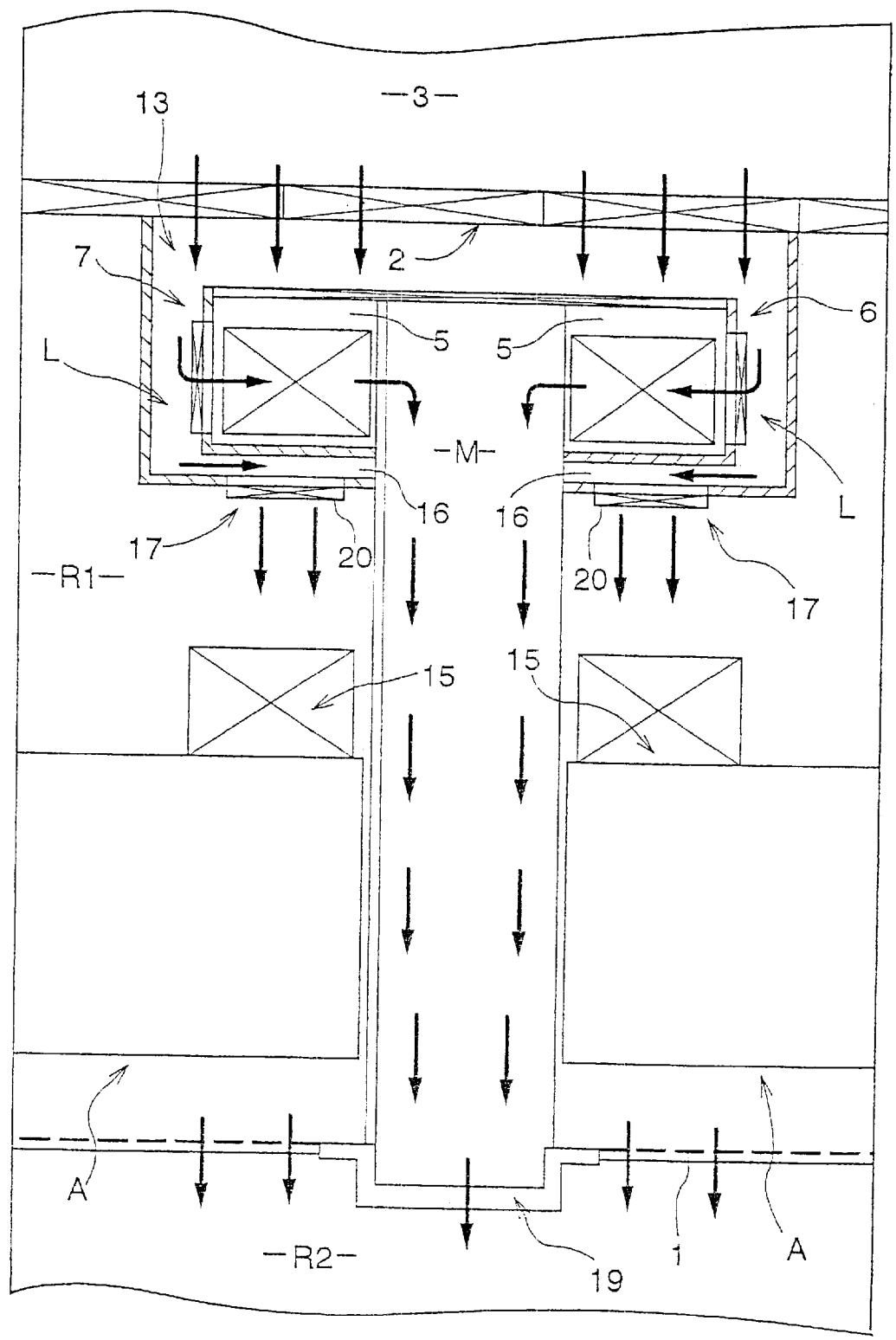
FIG. 7 is a side view in vertical section of an article storage apparatus in another embodiment.
Figure 8:
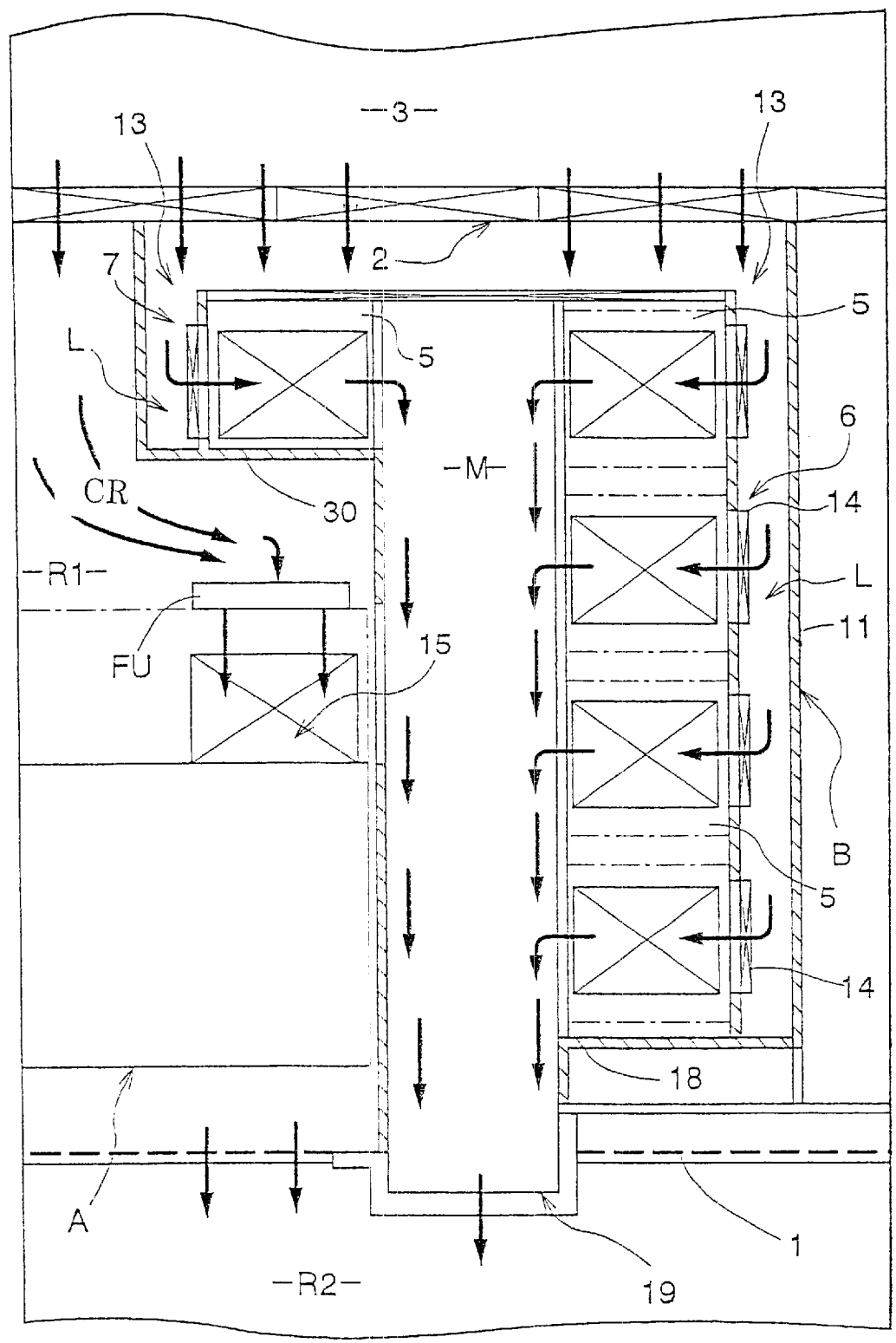
FIG. 8 is a view showing a ventilating state of a conventional article storage system.

(4) In the foregoing embodiment, the article storage apparatus has one of the main rack bodies 6 and 7 in a vertically overlapping relationship with the article processing apparatus A. Instead, as shown in FIG. 7, both main rack bodies 6 and 7 may be in a vertically overlapping relationship with article processing apparatus A. The article storage apparatus, instead of having the fore and aft pair of main rack bodies, may include only one main rack body vertically overlapping the article processing apparatus.

What is claimed is:

1. An article storage system for a clean room where air is blown down from a ceiling area thereof, comprising:

an article processing apparatus having an article receiving portion for loading and unloading articles and adapted to perform a predetermined processing of articles;

an article storage apparatus having a plurality of article storage units, said article storage apparatus including:

an article transport device for transporting the articles between said article receiving unit of said article processing apparatus and said article storage units; and an overlapping apparatus portion disposed over said article receiving portion of said article processing apparatus and vertically overlapping with said article receiving portion;

a rear air passage formed rearwardly of said article storage units an air intake for guiding clean air blown down from the ceiling area of said clean room into said rear air passage;

a front air passage formed in a space accommodating said article transport device forwardly of said article storage units;

wherein said air intake, said rear air passage, said article storage units and said front air passage are communicated with each other such that the air from said ceiling area flows through said air intake, said rear air passage and said article storage units and down said front air passage; and an air guide passage means provided to said overlapping apparatus portion of said article storage apparatus for guiding the air guided in by said air intake from said rear air passage to below said article storage units in said overlapping apparatus portion;

said air guide passage means having an air outlet for blowing the air, guided by said air guide passage device to below said article storage units, downwardly toward said article processing apparatus.

2. An article storage system for a clean room as defined in claim 1, wherein said air outlet has an air flow adjusting device for varying a flow of air therethrough.

3. An article storage system for a clean room as defined in claim 1, wherein said air guide passage device defines a generally horizontal air guide passage.

4. An article storage system for a clean room as defined in claim 1, wherein said air outlets are arranged, in side view, between said article storage units in said overlapping apparatus portion and said article processing apparatus.

5. An article storage system for a clean room as defined in claim 1, wherein said air guide passage is defined by floors of said article storage units in said overlapping apparatus portion and a part of a cover having said air outlets.

6. An article storage system for a clean room as defined in claim 5, further comprising a wall between said air guide passage and said front air passage to prevent the air escaping from said air guide passage to said front air passage.

7. An article storage system for a clean room as defined in claim 1, wherein said rear air passage is defined by rear planes of said article storage units and a vertical portion of a cover member spaced from said article storage units.

8. An article storage system for a clean room having an air feeder for blowing air downward from a ceiling area, and an air suction area disposed in a floor area for drawing the air, comprising:

an article processing apparatus having an article receiving portion for loading and unloading articles, and adapted to perform a predetermined processing of the articles;

an article storage apparatus having a plurality of article storage units, said article storage apparatus including:
a cover for covering at least part of peripheral areas of said article storage apparatus; and
an article transport device for transporting the articles between said article receiving unit of said article processing apparatus (A) and said article storage units, at least part of said article storage units overlapping said article receiving units in plan view;

a rear air passage formed between rear planes of said article storage units and said cover;

an air intake for guiding clean air blown down from the ceiling area of said clean room into said rear air passage;

a front air passage formed by action of said air suction area and formed in a space accommodating said article transport device forwardly of said article storage units;

wherein said air intake, said rear air passage, said article storage units and said front air passage are communicated with each other such that the air from said ceiling area flows through said air intake, said rear air passage and said article storage units and down said front air passage;

an air guide passage defined by bottom surfaces of said article storage units in said overlapping portion, and a surface supported by said article storage apparatus and downwardly spaced from said bottom surfaces, whereby the air received at said air intake is guided from said rear air passage to below said article storage units in said overlapping portion; and an air outlet formed in said surface for blowing the air, guided by said air guide passage to below said article storage units, downwardly toward said article processing apparatus.

* * * * *